United States Patent [19]

Väisänen

[11] Patent Number: 5,311,151
[45] Date of Patent: May 10, 1994

[54] I/Q MODULATOR AND DEMODULATOR HAVING A SINGLE BRIDGE

[75] Inventor: Risto Väisänen, Salo, Finland

[73] Assignee: Nokia Mobile Phones Ltd., Salo, Finland

[21] Appl. No.: 982,375

[22] Filed: Nov. 25, 1992

[30] Foreign Application Priority Data

Dec. 13, 1991 [FI] Finland ................................. 915892

[51] Int. Cl.$^5$ .......................... H03C 3/00; H03D 3/00
[52] U.S. Cl. ..................................... 332/105; 329/305; 329/306; 455/214; 455/337; 307/321; 328/208
[58] Field of Search ............... 332/103, 104, 105, 102; 329/304, 305, 306, 358, 366, 370, 308; 455/323, 325, 331, 333, 326, 214, 337; 328/32, 208; 307/512, 529, 321

[56] References Cited

U.S. PATENT DOCUMENTS

| | | | |
|---|---|---|---|
| 4,367,560 | 1/1983 | Hallford | 455/330 |
| 4,801,899 | 1/1989 | Ashida | 332/103 |
| 5,006,811 | 4/1991 | Kruger | 329/358 X |
| 5,153,536 | 10/1992 | Müller | 332/105 |
| 5,214,397 | 5/1993 | Müller | 332/105 |
| 5,214,796 | 5/1993 | Gorrie et al. | 455/330 X |
| 5,231,364 | 7/1993 | Mucke | 332/105 |

FOREIGN PATENT DOCUMENTS 63209207 8/1988 Japan.
2219704A 12/1989 United Kingdom .......... H03D 7/14

OTHER PUBLICATIONS

Microwave Journal, vol. 26, No. 1, Jan. 1983, Dedha, Mass. US, pp. 99-109, Don Neuf and Steve Spohrer: "Conventional and New Applications for the Quadrature If Microwave Mixer".

IEEE Microwave and Millimeter-Wave Monolithic Circuits Symposium, 1988, May, New York, U.S.A., pp. 71-74, Pavio et al.

Finnish Office Action Dated 9 Oct. 1992 For Priority Document 915892, And English Translation Thereof.

Primary Examiner—David Mis
Attorney, Agent, or Firm—Perman & Green

[57] ABSTRACT

An IQ modulator/demodulator wherein the 90° phase quadrature branches of an input signal are connected to different terminals of a common bridge, from which also the quivalents I and Q signals are obtained. To the bridge is also connected a local oscillator signal through a transformer. The transformer can be replaced with an active circuit, whereby the entire demodulator can be implemented in the form of an integrated circuit.

18 Claims, 2 Drawing Sheets ical I/Q modulator or I/Q demodulator implemented with passive components has been implemented using two double-balanced mixers, each including two RF transformers and four diodes. An example of such a generally used demodulator is presented in FIG. 1. Therein an input signal, i.e. intermediate frequency signal IF IN, is divided into two branches and between the branches a 90° phase quadrature is produced in a phase shifting circuit 101. Both of the signals 102 and 103 thus produced, in the present application referred to as mixed signals, are applied to double-balanced mixers 125, 125'. The mixer 125 of one of the branches is composed of balanced transformers 126 and 128, and of a bridge 127 comprising four diodes. After the transformer 126 a mixed signal 112 is connected to the terminals a, b of the diode bridge 127. To the other terminals c, d of the mixer 125, also a signal LO IN of a local oscillator is applied in the form of signal 124 through a power divider 111. The mixing results in an I signal 113 from the mixer 125 which is low pass filtered to provide an output signal I. The operation of the other mixer circuit 125' is equivalent, and respective reference numerals have been marked with an apostrophe('); the mixed signal 103 is connected to the terminals f, b of the diode bridge 125'. A Q signal with a 90° phase quadrature relative to the I signal, is obtained from the other mixer 125', thus providing markings I=In phase and Q=Quadrature (90° phase quadrature).

A demodulator known of prior art may, due to the symmetry in the circuitry, be implemented in a variety of ways in order to lead to the same result. This fact should be borne in mine in studying the description of the present invention, even though it is not separately mentioned in each context. Therefore, for instance a 90° phase quadrature may be produced between the local oscillator signals 124 and 124', whereby no phase difference is produced between the mixed signals 102 and 103 in the circuit 101 serving now as the power divider.

In accordance with the symmetry mentioned above, the operation of a demodulator circuit can analogously be transformed into the operation of a modulator circuit in which also a variety of possibilities of implementing different functions are viable due to the symmetry, as is well known in the art.

SUMMARY OF THE INVENTION

According to a first aspect of the present invention there is provided a modulator circuitry comprising a bridge means for mixing an in-phase (I) signal and a quadrature (Q) signal with a local oscillator signal to produce a first and a second mixed signals, coupled to a means for inducing a substantially 90° phase shift in the first mixed signal, coupled to means for combining the first mixed signal after phase shifting with the second mixed signal to produce an output signal, characterized in that the in-phase (I) signal and the quadrature (Q) signal are coupled to different terminals of the same bridge means, and the local oscillator signal is coupled to other of the terminals of said bridge means.

According to a second aspect of the present invention there is provided a demodulator circuitry comprising a divider means for dividing an input signal into a first signal and a second signal having a substantially 90° mutual phase difference, coupled to bridge means for mixing the first mixed signal and second signal with a local oscillator signal to produce output signals in the form of an in-phase (I) signal and a quadrature (Q) signal characterized in that the first mixed signals and second mixed signal are coupled to different terminals of the same bridge means and the local oscillator signal is coupled to other of the terminals of the bridge means.

An advantage of an IQ modulator in accordance with the present invention is the simplification of the modulator and demodulator arrangement of the type initially described.

An I/Q demodulator or demodulator in accordance with the present invention may also be implemented using strip line transformers produced on the circuit board to serve as transformers for the mixers. This kind of design is less expensive than using separate transformers but it requires more surface area, which in some instances may turn out to be a serious drawback.

In the circuitry of the modulator or demodulator in accordance with the present invention, an active circuit may preferably be substituted for the transformer, said circuit producing a 180° degree phase shift in the local oscillator signal.

Furthermore, in the circuitry of the modulator or demodulator in accordance with the present invention the diodes of a diode bridge can be replaced by field effect transistors (FET), whereby the entire modulator or demodulator is implementable in the form of an integrated circuit.

The circuitry of the modulator or demodulator in accordance with the present invention can be used particularly in GSM and other mobile phones in which the new circuitry offers a design in comparison with the state of art which is less expensive, lighter in weight and less space and power consuming, and in operation, more reliable.

BRIEF DESCRIPTION OF THE DRAWINGS

Embodiments of the present invention are described below, by way of example, with the aid of the accompanying drawings, in which.

DETAILED DESCRIPTION OF THE INVENTION

Figure 2:
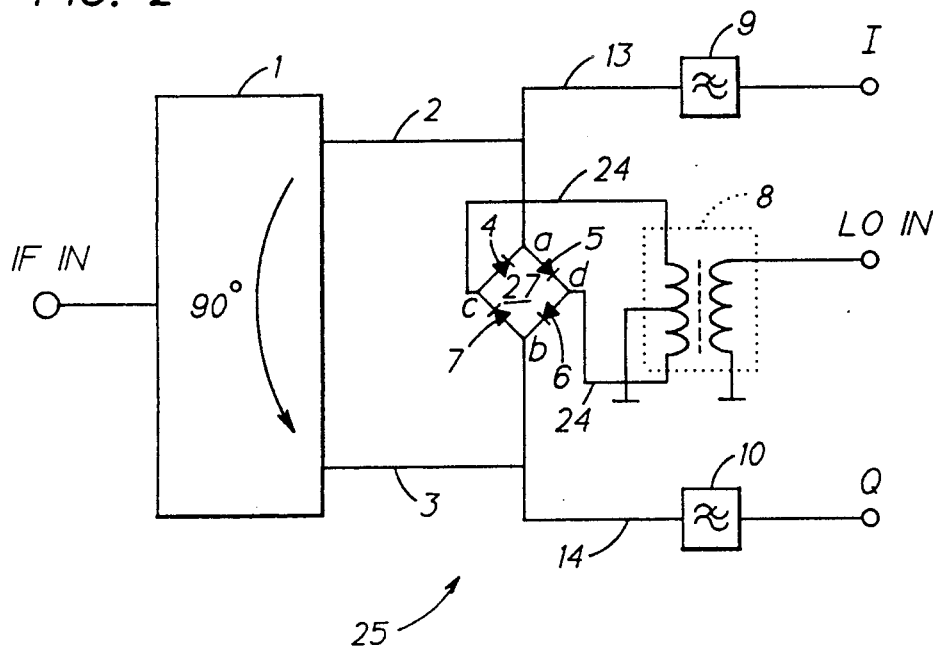
FIG 2 is a schematic circuit diagram of an I/Q demodulator in accordance with the present invention.

FIG. 2 depicts a simplified circuit diagrams of an I/Q demodulator. In addition to the phasing blocks 1, only one Radio Frequency (RF) transformer 8 and four diodes 4, 5, 6 and 7 are used in the mixer 25. This is achieved by combining the common parts of two mixers. The input signal IF IN is divided into two branches 2 and 3 in the divider circuit 1. A mixed signal 2 is connected between the terminal (a) of the diode bridge 27 and the earth; a mixing signal 3 is connected between the terming (b) of the diode bridge 27 and the earth. A local oscillator signal LO IN is conducted through the transformer 8 and connected in the form of a signal 24 with the opposite terminals (c, d) of the diode bridge 27. As a result of the mixing, I and Q signals 13 and 14 are obtained which are conducted through the low pass filtering 9 and 10, respectively, forming output signals I and Q. The transformer is a balanced transformer, preferably a strip-line transformer. Most preferably the balance control is coupled to the transformer.

Two mixers can be combined in the manner presented above because in the positive half-cycle of the local oscillator signal LO IN only the diodes 4 and 5 are conductive. On the other hand, the diodes 4 and 7 between the I and Q branches, and 5 and 6, are never simultaneously conductive, whereby the signals of different branches are not mixed or summed with one another. In the positive half-cycle of the signal 24, a mixed signal 2 travels from the terminal (a) through the diodes 4 and 5 to the terminals (c and d) and from there through the secondary of the transformer 8 to the signal earth, whereby the diodes 6 and 7 are in a non-conductive state, and as a result, the mixed signal 2 and the resulting signal 13 have a signalling sense been separated from the signals 3 and 14 of the Q branch.

The mixing result 13 is obtained from the same terminal (a) to which the mixed signal 2 has been connected. In the negative half-cycle of the signal 24 the mixed signal 3 travels in like manner from the terminal b through the diodes 6 and 7 to the terminals c and d and from there through the secondary of the transformer 8 to the signal earth, whereby the diodes 4 and 5 are in non-conductive state, and as a result, the mixed signal 3 and the resulting signal 14 have in signalling sense been separated from the signals 2 and 13 of the I branch. The mixing result 14 of the Q branch is obtained from the terminal b between the diodes 6 and 7.

Figure 3:
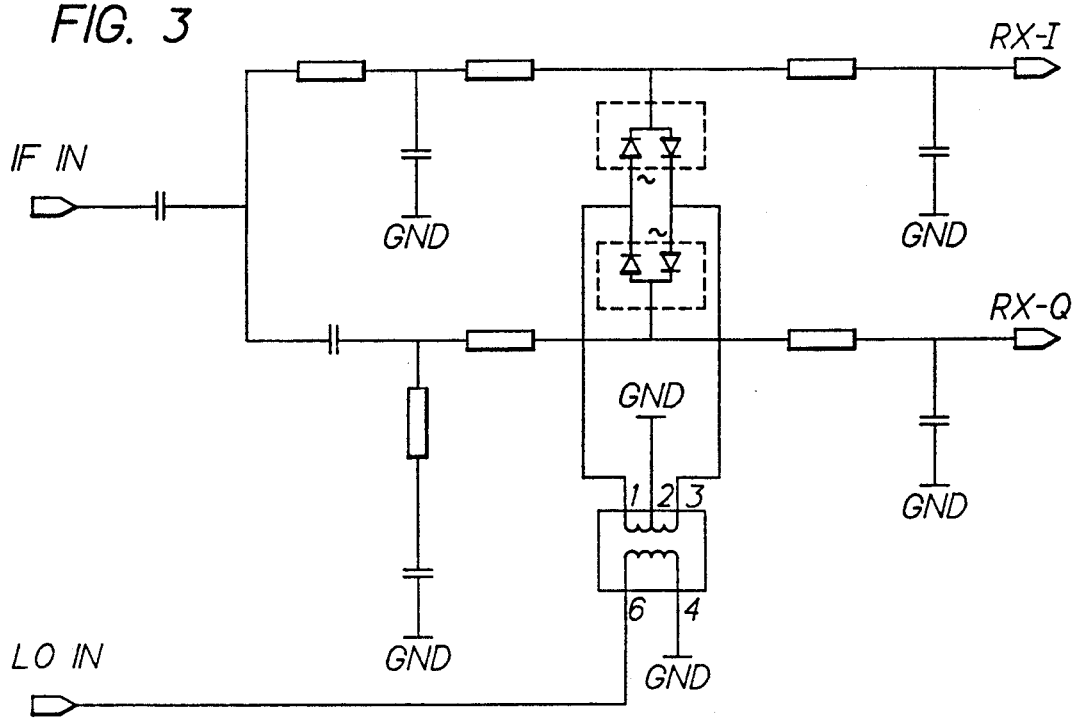
FIG. 3 is a more detailed example of the implementation of the demodulator as shown in FIG. 2.

A more detailed circuit diagram of the I/Q demodulator, shown in principle in FIG. 2, is presented in FIG. 3.

The function of the phasing block 1 has been implemented by means of a resistor R185 and capacitor C186 regarding the I branch, by a resistor R187 and C188 regarding the Q branch. The low pass filterings 9 and 10 have been implemented using a resistor R189 and capacitor C189 regarding the I branch, by a resistor R190 and capacitor C190 regarding the Q branch. In FIG. 3 the diode bridge 27 has been implemented with the aid of two pairs of diodes (circuits U185 and U186). Component T185 corresponds to the transformer 8. The outputs RX-I and RX-Q correspond to the outputs I and Q shown in FIG. 2. The resistors R186 and R188 and the capacitor C188 relate to direct current separation and impedance matching of the circuit.

Figure 4:
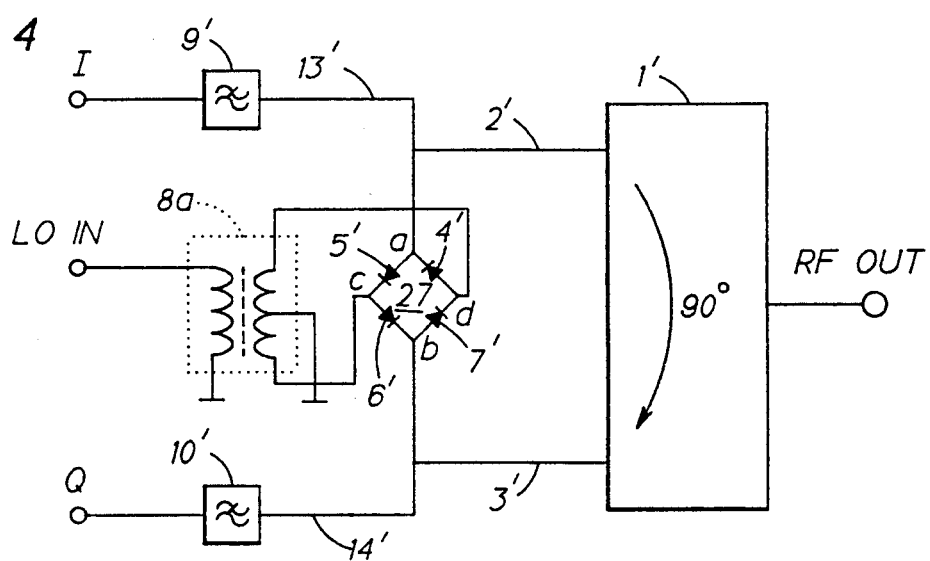
FIG. 4 shows the circuit diagram of an I/Q modulator in accordance with the present invention.

FIG. 4 shows the circuit diagram of an I/Q modulator in accordance with the invention. The input signals are signals I and Q which are conducted through filters 9' and 10' to a diode bridge 27' formed by diodes 4'-7'. An oscillator signal LO IN is conducted to the diode bridge through the transformer 8a. The mixed signals 2' and 3' are conducted to the 4 phasing circuit 1', from the output of which a combined output signal RF OUT is obtained. The operation of the modulator can be understood with the aid of the above description concerning the demodulator by taking the logical symmetry into account.

Figure 1:
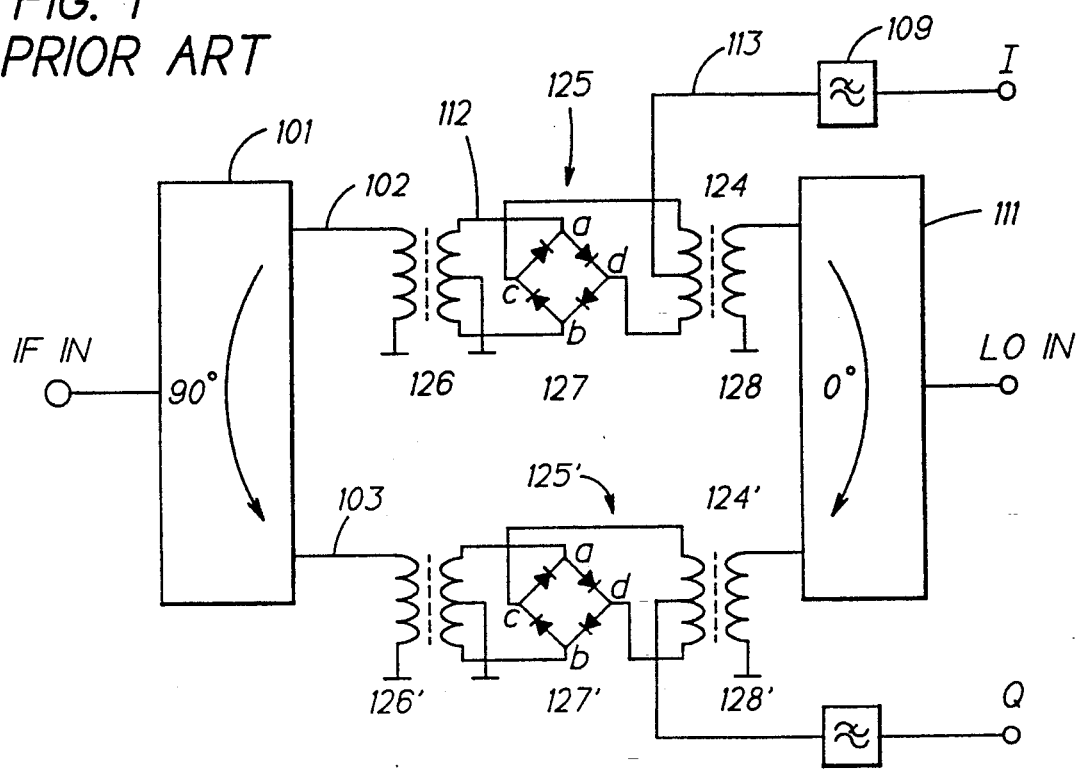
FIG. 1 illustrates a prior art demodulator implementation.

When the modulator or demodulator in accordance with the invention (FIGS. 2 to 4) on the one hand and the prior art demodulator (FIG. 1) on the other are compared, it is seen that in the invention a lower signal level of local oscillators can be used because the signal of a local oscillator need not be divided into two branches with a power divider or with a phasing circuit. This in part simplifies the designing of the oscillator circuit and reduces the power consumption thereof.

In an embodiment of the present invention a balance control (not shown) can be added into the transformer 8 or 8a for minimizing the carrier wave leakage of the modulator.

For the transformer, also a strip line transformer can be used, even when a limited space is available because only one transformer is now needed in comparison with the four transformers of the state of art.

Figure 5:
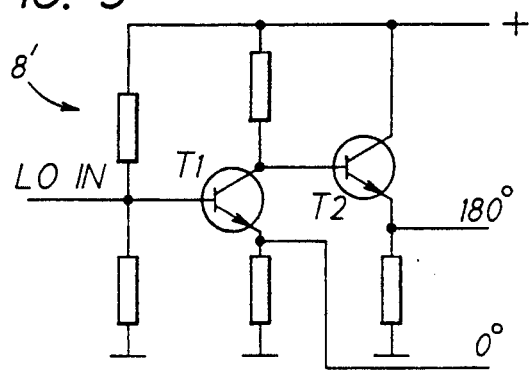
FIG. 5 illustrates the substitution of an active circuit for the transformer in the circuitry in accordance with a second embodiment of the invention.

The I/Q modulator and I/Q demodulator in accordance with the present invention may further be developed so that some other circuitry or component substitutes for the transformer 8 or 8a presented in FIGS. 2 and 4, with which a 180° phase shifting of the signal is provided. For instance, in high frequencies a transfer line of half-wave length (not shown) can be used. In lower frequencies, an active phasing circuit implemented with semiconductors can be used. FIG. 5 shows an example of such an embodiment in the form of a phasing circuit 8' implemented with transistors. In this instance, the output signal 0° corresponds to the control signal of the positive half-cycle, as discussed in respect of FIG. 2. Similarly, the output signal 180° is equivalent to the control signal of the negative half-cycle, as discussed in respect of FIG. 2.

Figure 6:
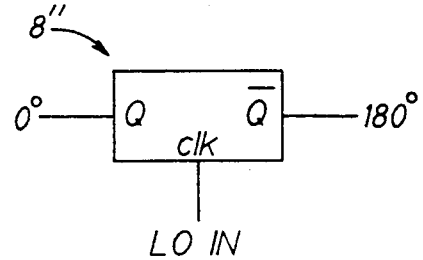
FIG. 6 illustrates a second example of a divider circuit substituted for the transformer.

An active 180° phase shifting member may also be implemented with a divider circuit 8" (FIG. 6), from the outputs of which the requisite output signals (0° and 180°) are provided.

In an embodiment in which one or more active components substitutes for the transformer 8 or 8a, the entire modulator, or demodulator may be implemented using integrated circuits technique, e.g. on a single IC circuit. In smaller frequencies, CMOS technology is appropriate. In higher frequencies, for instance GaAS techniques or bipolar techniques are appropriate for integration.

In view of the foregoing it will be clear to a person skilled in the art that modifications may be incorporated without departing from the scope of the present invention.

I claim:
1. Modulator circuitry comprising mixing means, said mixing means comprising bridge means for mixing an inphase (I) signal and a quadrature (Q) signal respectively with a local oscillator signal to produce a first mixed signal and a second mixed signal, means for inducing a substantially 90° phase shift in the first mixed signal, means for combining the first mixed signal after phase shifting with the second mixed signal to produce an output signal,
   characterized in that the in-phase (I) signal and the quadrature (Q) signal are applied to different terminals of a single bridge, and the local oscillator signal is applied to other of the terminals of said single bridge.

2. Circuitry as claimed in claim 1, wherein said single bridge comprises four diodes.

3. Circuitry as claimed in claim 1, wherein said single bridge comprises four Field-Effect Transistors.

4. Circuitry as claimed in claim 1, wherein the first mixed signal and in-phase (I) signal are respectively produced at and applied to said single bridge via a first terminal and the second mixed signal and the quadrature signal are respectively produced at and applied to said single bridge via a second terminal.

5. Circuitry as claimed in claim 1, wherein the local oscillator signal is applied to said single bridge through an active circuit providing a 180° phase shift in the local oscillator signal.

6. Circuitry as claimed in claim 1, wherein the modulator circuitry is implemented in the form of one or more integrated circuits.

7. Circuitry as claimed in claim 1, wherein the local oscillator signal is coupled to the bridge means through a transfer line of half-wave length.

8. Circuitry as claimed in claim 1, wherein the local oscillator signal is coupled to the bridge means through a balanced transformer.

9. Circuitry as claimed in claim 8, wherein the transformer is a stripline transformer.

10. Demodulator circuitry comprising a divider phase shifter means for dividing an input mixed signal into a first mixed signal and a second mixed signal having a substantially 90° mutual phase difference, mixing means, said mixing comprising bridge means for mixing the first mixed signal and second mixed signal with a local oscillator signal to produce output signals in the form of an in-phase (I) signal and a quadrature (Q) signal,
characterized in that the first mixed signal and second mixed signal are applied to different terminals of a single bridge and the local oscillator signal is applied to other of the terminals of said single bridge.

11. Circuitry as claimed in claim 10, wherein said single bridge comprises four diodes.

12. Circuitry as claimed in claim 10, wherein said single bridge comprises four Field-Effect Transistors.

13. Circuitry as claimed in claim 10, wherein the first mixed signal and in-phase (I) signal are respectively applied to and produced at said single bridge via a first terminal and the second mixed signal and the quadrature signal are respectively applied to and produced at said single bridge via a second terminal.

14. Circuitry as claimed in claim 10, wherein the local oscillator signal is applied to said single bridge through an active circuit providing a 180° phase shift in the local oscillator signal.

15. Circuitry as claimed in claim 10, wherein the demodulator circuitry is implemented in the form of one or more integrated circuits.

16. Circuitry as claimed in claim 10, wherein the local oscillator signal is coupled to said single bridge through a transfer line of half-wave length.

17. Circuitry as claimed in claim 10, wherein the local oscillator signal is coupled to said single bridge through a balanced transformer.

18. Circuitry as claimed in claim 17, wherein the transformer is a stripline transformer.

* * * * *